United States Patent
Gilton et al.

(10) Patent No.: US 6,646,902 B2
(45) Date of Patent: Nov. 11, 2003

(54) METHOD OF RETAINING MEMORY STATE IN A PROGRAMMABLE CONDUCTOR RAM

(75) Inventors: Terry L. Gilton, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,648

(22) Filed: Aug. 30, 2001

(65) Prior Publication Data

US 2003/0043631 A1 Mar. 6, 2003

(51) Int. Cl.[7] ............ G11C 17/00; G11C 11/00
(52) U.S. Cl. ............ 365/100; 365/148; 365/163; 257/2; 257/3; 257/5
(58) Field of Search ............ 365/100, 148, 365/163; 257/2, 3, 5, 390

(56) References Cited

U.S. PATENT DOCUMENTS

| | | |
|---|---|---|
| 3,622,319 A | 11/1971 | Sharp |
| 3,743,847 A | 7/1973 | Boland |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,671,618 A | 6/1987 | Wu et al. |
| 4,795,657 A | 1/1989 | Formigoni et al. |
| 4,800,526 A | 1/1989 | Lewis |
| 4,847,674 A | 7/1989 | Sliwa et al. |
| 5,177,567 A | 1/1993 | Klersy et al. |
| 5,219,788 A | 6/1993 | Abernathey et al. |
| 5,238,862 A | 8/1993 | Blalock et al. |

(List continued on next page.)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Abdel–All, A.; Elshafie, A.; Elhawary, M.M., DC electric–field effect in bulk and thin–film Ge5As38Te57 chalcogenide glass, Vacuum 59 (2000) 845–853.

Adler, D.; Henisch, H.K.; Mott, S.N., Amorphous memories and bistable switches, J. Vac. Sci. Technol. 9 (1972) 1182–1189.

Adler, M.A.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

(List continued on next page.)

*Primary Examiner*—Son Mai
(74) *Attorney, Agent, or Firm*—Dickstein Shapiro Morin & Oshinsky LLP

(57) ABSTRACT

A non-volatile memory device, such as a Programmable Conductor Random Access Memory (PCRAM) device, having an exemplary memory stored state retention characteristic is disclosed. There is provided a method for retaining stored states in a random access memory device generally comprising the steps of programming a memory cell or an array of memory cells by applying a first voltage to the cells and stabilizing the cells by applying a second voltage to the cells, which is less than the first voltage. The second voltage, which acts as a stabilizing voltage, may be a read-out voltage. The second voltage may also be continuously applied to the cells. The second voltage may also be provided as a sweep voltage, a pulse voltage, or a step voltage.

111 Claims, 4 Drawing Sheets

U.S. PATENT DOCUMENTS

| | | |
|---|---|---|
| 5,272,359 A | 12/1993 | Nagasubramanian et al. |
| 5,315,131 A | 5/1994 | Kishimoto et al. |
| 5,324,772 A | 6/1994 | Schmidt-Thuemmes et al. |
| 5,350,484 A | 9/1994 | Gardner et al. |
| 5,360,981 A | 11/1994 | Owen et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A * | 7/1996 | Ovshinsky et al. ............ 257/3 |
| 5,536,947 A * | 7/1996 | Klersy et al. .................. 257/3 |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,837,564 A * | 11/1998 | Sandhu et al. ................ 438/95 |
| 5,841,150 A | 11/1998 | Gonzalez et al. |
| 5,846,889 A | 12/1998 | Harbison et al. |
| 5,883,827 A * | 3/1999 | Morgan ...................... 365/100 |
| 5,896,312 A | 4/1999 | Kozicki et al. |
| 5,914,893 A | 6/1999 | Kozicki et al. |
| 5,920,788 A | 7/1999 | Reinberg |
| 5,949,088 A * | 9/1999 | Morgan ......................... 257/5 |
| 5,998,066 A | 12/1999 | Block et al. |
| 6,072,716 A | 6/2000 | Jacobson et al. |
| 6,077,729 A | 6/2000 | Harshfield |
| 6,084,796 A | 7/2000 | Kozicki et al. |
| 6,117,720 A | 9/2000 | Harshfield |
| 6,143,604 A | 11/2000 | Chiang et al. |
| 6,177,338 B1 | 1/2001 | Liaw et al. |
| 6,236,059 B1 | 5/2001 | Wolstenholme et al. |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,469,364 B1 | 10/2002 | Kozicki |
| 6,473,332 B1 | 10/2002 | Ignatiev et al. |
| 6,487,106 B1 | 11/2002 | Kozicki |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |

OTHER PUBLICATIONS

Afifi,M.A., Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Gesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence de metal des electrodes sur les caracteristiques courant–tension des structures M–Ag2Se–M, Thin Solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S–to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchard, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P., Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalogenide glasses, J. Am. Ceram, Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

de Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R., Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold swithching in semiconducting glass Ge21Se17TeTe62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H., El–Korashy, A., Influence of composition on the electrical and optical properties of Ge20BixSe80–x films, Thin Solid Films 376 (2000) 236–240.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol.(a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal-a-Si:H-metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan, J. Appl. Phys. 13 (1974) 1163–1164.

Hegab, N.A.; Fadel, M.; Sedeek, K., Memory switching phenomena in this films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a/Si:H/V thin film devices, J. Non–Cryst. Solids 227–230 (1998) 1187–1191.

Hu, J.; Hajto, J.; Snell, A.J.; Owen, A.E., Rose, M.J., Capacitance anomaly near the metal–non–metal transition in Cr-hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R., Kikuchi, M., Photovoltaic study on the photo-enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T., Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. 26 (1987) 15–21.

Kawasaki, M.; Kawamura, J.; Nakamura, Y.; Aniya, M., Ionic conductivity of Agx(GeSe3) 1–x (0<=<=0.571) glasses, Solid state Ionics 123 (1999) 259–169.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kowitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Wang, Y.; Boolchand, P., Dual chemical role of Ag as an additive in chalcogenide glasses, Phys. Rev. Lett. 83 (1999) 3848–3851.

Miyatani, S.-y., Electronic and ionic conduction in (AgxCu1–x)2Se, J. Phys. Soc. Japan 34 (1973) 423–432.

Miyatani, S.-y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalgogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on . . . .

Tanaka, K., Ionic and mixed conductions in Ag photodoping process, Mod. Phys. Lett. B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant, S.;Peytavin, S.;Ribes,M.;Flank,A.M.;Dexpert, H.; Lagarde,J.P., Silver chalcogenide glasses Ag–Ge–Se: Ionic conduction and exafs structural investigation, Transport– structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov, P., Electrode–limited currents in the thin–film M–Ge–Se–M system, Mat. Chem. And Phys. 21 (1989) 447–454.

Wang, S.–J.; Misium, G.R.; Camp, J.C.; Chen, K.–L.; Tigelarr, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag. J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Axon Technologies Corporation, Technology Description: *Programmable Metalization Cell*(PMC), pp. 1–6 (Pre–May 2000).

Helbert et al., Intralevel hybrid resist process with submicron capability, SPIE vol. 333 Submicron Lithography, pp. 24–29 (1982).

Hilt, Dissertation: Materials characterization of Silver Chalcogenide Programmable Metalization Cells, Arizona State University, pp. Title p.–114 (UMI Company, May 1999).

Hirose et al., High Speed Memory Behavior and Reliability of an Amorphous $As_2S_3$ Film Doped Ag, Phys. Stat. Sol. (a) 61, pp. 87–90 (1980).

Holmquist et al., Reaction and Diffusion in Silver–Arsenic Chalcogenide Glass Systems, 62 J. Amer. Ceram. Soc., No. 3–4, pp. 183–188 (Mar.–Apr. 1979).

Huggett et al., Development of silver sensitized germanium selenide photoresist by reactive sputter etching in $SF_6$, 42 Appl. Phys. Lett., No. 7, pp. 592–594 (Apr. 1983).

Kawaguchi et al., Mechanism of photosurface deposition, 164–166 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors –E.D. Wachsman et al., The Electrochemical Society, Inc., 1–12 (1999).

Kozicki, et al., Nanoscale effects in devices based on chalcogenide solid solutions, Superlattices and Microstructures, 27, 485–488 (2000).

Kozicki, et al., Nanoscale phase separation in Ag–Ge–Se glasses, Microelectronic Engineering, vol. 63/1–3, 155–159 (2002).

M.N. Kozicki and M. Mitkova, Silver incorporation in thin films of selenium rich Ge–Se glasses, Proceedings of the XIX International Congress on Glass, Society for Glass Technology, 226–227 (2001).

McHardy et al., The dissolution of metals in amorphous chalcogenides and the effects o electron and ultraviolet radiation, 20, J. Phys. C.: Solid State Phys., pp. 4055–4075 (1987)f.

Owen et al., Metal–Chalcogenide Photoresists for High Resolution Lithography and Sub–Mircon Structures, Nanostructure Physics and Fabrication, pp. 447–451 (M. Reed ed. 1989).

Shimizu et al., The Photo–Erasable Memory Switching Effect of Ag Photo–Doped Chalcogenide Glasses, 46 B. Chem Soc. Japan, No. 12, pp. 3662–3365 (1973).

* cited by examiner

METHOD OF RETAINING MEMORY STATE IN A PROGRAMMABLE CONDUCTOR RAM

FIELD OF THE INVENTION

The present invention relates to the field of integrated circuits and, in particular, retaining stored states in a memory device.

BACKGROUND OF THE INVENTION

An essential semiconductor component is semiconductor memory, such as a random access memory (RAM). RAM allows the user to execute both read and write operations on memory cells. Typically, RAM devices are volatile, in that stored data is lost once the power source is disconnected or removed. Typical examples of RAM devices include dynamic random access memory (DRAM), synchronized dynamic random access memory (SDRAM) and static random access memory (SRAM).

In recent years, the memory capacity, i.e., the number and density of memory cells in memory devices have been increasing. Accordingly, the size of each cell (including storage capacitor size) has been shrinking, which also shortens the cell's data holding time. Typically, a memory device receives a stabilizing request command in the conventional standardized cycle, about every 100 milliseconds. However, with increasing cell number and density, it is becoming more and more difficult to stabilize all memory cells at least once within the stabilizing cycle.

DRAMS and SDRAMs are volatile in the sense that the stored data, typically in the form of charged and discharged capacitors contained in memory cells arranged in a large array, will dissipate the charge after a relatively short period of time because of a charge's natural tendency to distribute itself into a lower energy state. DRAM is particularly volatile in that it should be stabilized, i.e., recharged, typically every 100 milliseconds, in order to retain information stored on its memory cells.

Recently, studies have been conducted on the use of chalcogenide glasses as non-volatile memory cells in the semiconductor industry. One such non-volatile memory device, which uses chalcogenide glass non-volatile memory cells is known as a programmable conductor RAM (PCRAM). Chalcogenide glasses typically comprise selenium (Se), sulfur (S) and tellurium (Te). Two mechanisms are responsible for the operation of the chalcogenide glasses as non-volatile memory elements: (1) phase change and (2) ionic conductor dendrite formation. The phase change mechanism is the most studied and relates to the formation of a crystalline filament during application of a potential across two electrodes placed around a chalcogenide material. This crystalline filament has a lower resistance than the bulk chalcogenide material. This way, a conductive path is formed between the two electrodes which basically turns the cell into a resistor. To change the state of the cell from "on" to "off" or vice-versa, a potential is again applied across the cell having a defined pulse shape, length, and amplitude, which will "melt" the crystalline conductive path and render it amorphous.

The ionic conductor dendrite formation is based on the ability of a metal-doped chalcogenide glass to maintain an amorphous state over a wide range of metal dopant concentrations. Two electrodes (cathode and anode) are formed opposite to each other and on each side of the glass, which may be a chalcogenide-metal ion composition, typically a germanium-selenium (Ge—Se) glass doped with silver (Ag), or a stable amorphous material.

When a voltage is applied to the electrodes, a conducting dendrite grows from the cathode towards the anode. When the voltage is reversed, the already formed dendrite dissolves or retracts. The growth rate of the dendrite depends upon the applied voltage and time. Although memory cells constructed with chalcogenide glasses and operated using the dendrite formation principles hold a stored value for a much longer period of time, e.g., days, than a conventional DRAM or SDRAM cell, (which rely on capacitors to store charge), it has been found that a grown dendrite may begin to decay.

There is a need for a method of stabilizing non-volatile chalcogenide memory cells, such as PCRAM cells.

BRIEF SUMMARY OF THE INVENTION

The present invention relates to a PCRAM device and a method of retaining memory therein. The above and other features and advantages of the invention are achieved by programming a non-volatile memory cell comprising a metal doped glass layer by applying a first voltage across the cell and periodically stabilizing the memory cell by applying a second voltage, which is less than the first voltage across the cell.

In an exemplary embodiment a read-out voltage is used for stabilizing the cell, but the stabilizing voltage and read voltage may also be separate voltages. The voltage used for stabilizing the cell may be applied as a sweep, pulse or step voltage. The voltage used for stabilizing the cell may also be applied continuously.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that various structural, logical and electrical changes may be made without departing from the spirit or scope of the invention.

The term "substrate" used in the following description may include any supporting structure including but not limited to a semiconductor substrate that has an exposed substrate surface. Structure should be understood to include silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged. Similarly, the terms "germanium" and "selenium" are intended to include not only elemental germanium and selenium, but germanium and selenium with other trace metals or in various alloyed combinations with other metals as known in the semiconductor industry, as long as such germanium or selenium alloy is conductive, and as long as the physical and electrical properties of the germanium or selenium remain unchanged.

The present invention relates to a programmable conductor memory cell and a method and apparatus for retaining its memory state. The present invention will be described as set forth in an exemplary embodiment illustrated in FIGS. 1–6 in the context of a random access memory. However, it should be understood that the invention may be used in other types of memory devices. Also, other embodiments may be used and structural or logical changes may be made to the described and illustrated embodiment without departing from the spirit or the scope of the present invention.

Figure 1:
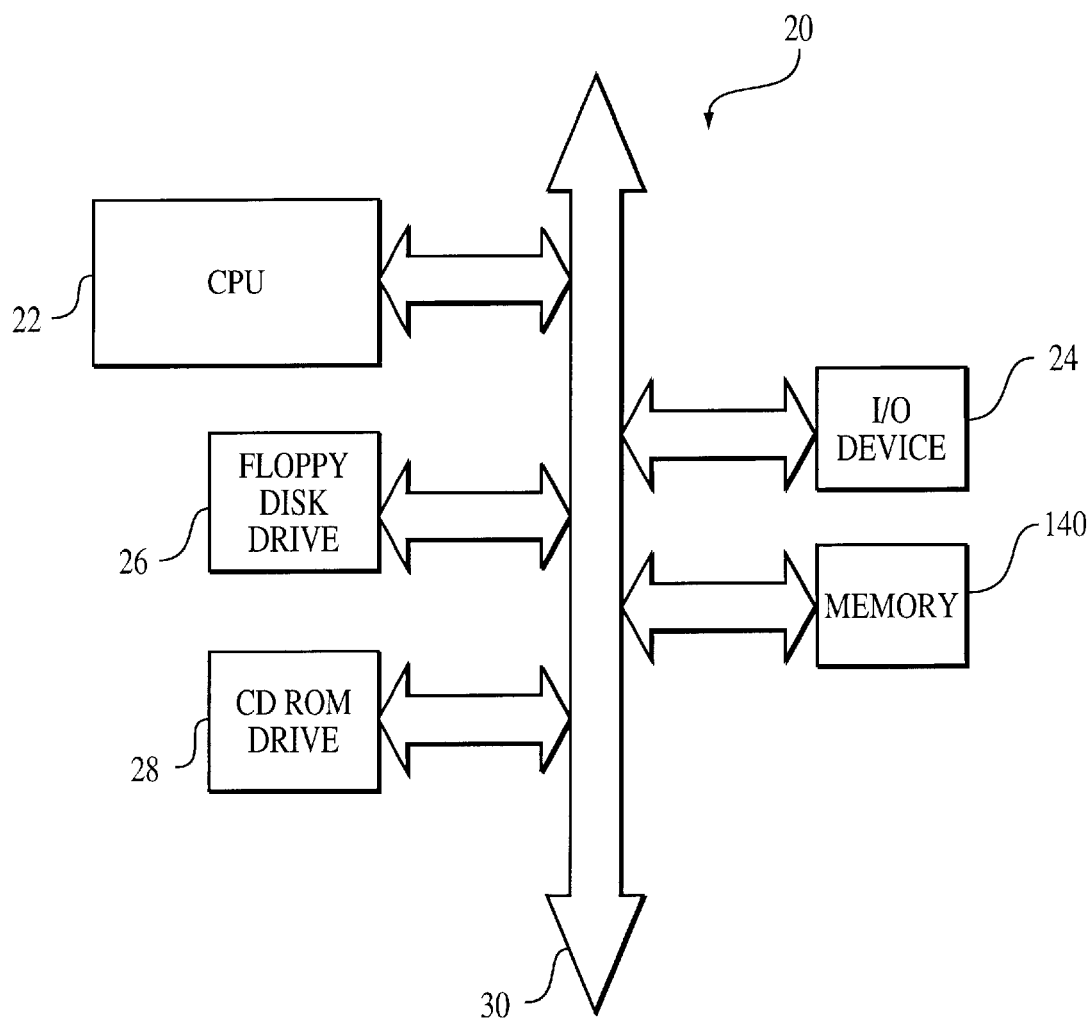
FIG. 1 illustrates a computer system having one or more memory devices that contains non-volatile memory cells according to the present invention.

FIG. 1 is a block diagram of a processor system 20 that includes a memory circuit 140, which includes one or more integrated circuit memory devices containing PCRAM non-volatile memory cells. A processor system, such as a computer system, generally comprises a central processing unit (CPU) 22, such as a microprocessor, a digital signal processor, or other programmable digital logic device, which communicates directly or indirectly with one or more input/output (I/O) devices 26 over one or more buses 30. The memory circuit 140 communicates with the central processing unit 22 directly or through a memory conductor and over one or more busses 30.

Figure 2:
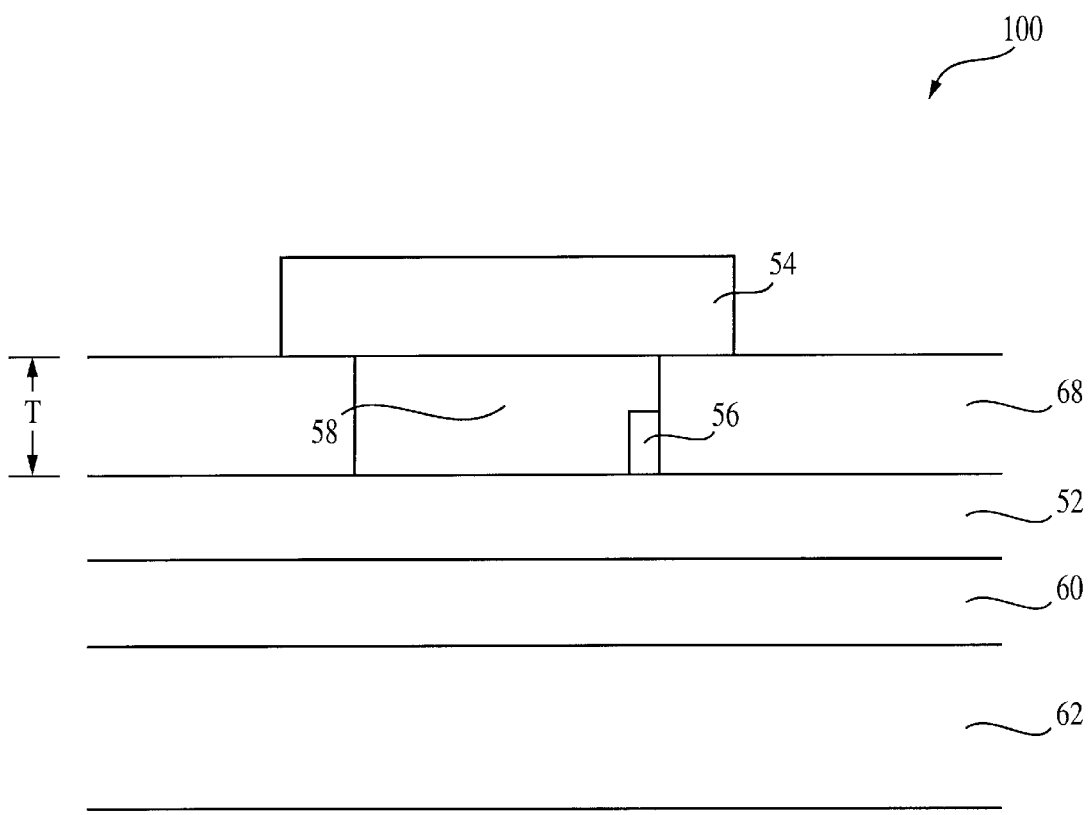
FIG. 2 is a cross-sectional view of a non-volatile memory cell according to an embodiment of the present invention.

In the case of a computer system, the processor system may include peripheral devices such as a floppy disk drive 26 and a compact disk read only memory (CD ROM) drive 28, which also communicate with CPU 22 over the bus 30. Memory circuit 140 is preferably constructed as one or more integrated circuit memory devices, each of which includes one or more PCRAM non-volatile memory cells 100 (FIG. 2). If desired, the memory circuit 140 may be combined with the processor, for example CPU 22, in a single integrated circuit.

FIG. 2 illustrates the construction of a PCRAM non-volatile memory cell. Non-volatile memory cells 100 in accordance with the present invention are generally fabricated over a semiconductor substrate 62 and comprise a first insulating layer 60 formed over a substrate 62, a first metal electrode 52 is formed on the first insulating layer 60, a second insulating layer 68 is formed on the first electrode 52, and a metal doped glass 58 is disposed in an opening in the second layer such that the metal doped glass 58 is in contact with the first electrode 52. A second metal electrode 54 is formed in contact with the metal doped glass 58.

The metal doped glass 58 may be formed over the first electrode 52 to dimensions (i.e., length, thickness, and width) suitable to produce desired electrical characteristics of the non-volatile memory cell 100. In an exemplary embodiment, the metal doped glass 58 comprises a silver-doped germanium-selenium chalcogenide glass.

The first insulating layer 60 may be formed of a conventional insulating oxide, such as silicon oxide ($SiO_2$), or a low dielectric constant material such as, for example, polyimide, spin-on-polymers (SOP), parylene, flare, polyarylethers, polytetrafluoroethylene, benzocyclobutene (BCB), SILK, fluorinated silicon oxide (FSG), NANOGLASS or hydrogen silsesquioxane, among others. The present invention is not limited, however, to the above-listed materials and other insulating and/or dielectric materials known in the industry may be used. The first insulating layer 60 may be formed by any known deposition methods, such as sputtering by chemical vapor deposition (CVD), plasma enhanced CVD (PECVD) or physical vapor deposition (PVD), among others.

The second insulating layer 68 may be formed, for example, between the first electrode 52 and the second electrode 54. The second insulating layer 68 may be formed by any known deposition methods, such as sputtering by chemical vapor deposition (CVD), plasma enhanced CVD (PECVD) or physical vapor deposition (PVD), among others. The second insulating layer 68 may comprise any suitable insulating material that provides a diffusion barrier for metals, such as silver, in the metal-doped glass. A preferred insulating material is silicon nitride, but those skilled in the art will appreciate that there are numerous suitable insulating materials.

The thickness T of the second insulating layer 68 is preferably about 500 Angstroms. The electrodes 52, 54 may comprise any suitable conductive material. The cathode or first electrode 52 is preferably tungsten. The second electrode 54 preferably comprises a silver containing metal and is more preferably silver metal.

When a voltage is applied to the electrodes 52, 54, a metal dendrite 56 grows from the first electrode 52 towards the second electrode 54. The dendrite 56 will continue to grow until the dendrite electrically shorts the electrodes 52, 54. When the voltage is reversed, the dendrite 56 retracts towards the first electrode 52 and little or no dendrite 56 will grow from the second electrode 54. In this way a cell may store a resistance value in the form of a grown dendrite or the absence of a dendrite.

The growth rate of the dendrite 56 depends upon the value of the voltage applied and the rate or length of time the voltage is applied. Generally, low voltages result in relatively slow growth rates whereas higher voltages result in more rapid growth rates. Changes in the length of the dendrite 56 affect the impedance of the non-volatile memory cell 100. When the voltage is removed from the electrodes 52, 54, the metal dendrite 56 remains intact for relatively long periods of time.

Although the embodiments described above refer to the formation of only one non-volatile memory cell 100, it should be understood that the present invention contemplates the formation of any number of such non-volatile memory cells, which can be formed as one or more memory cell arrays.

Figure 3:
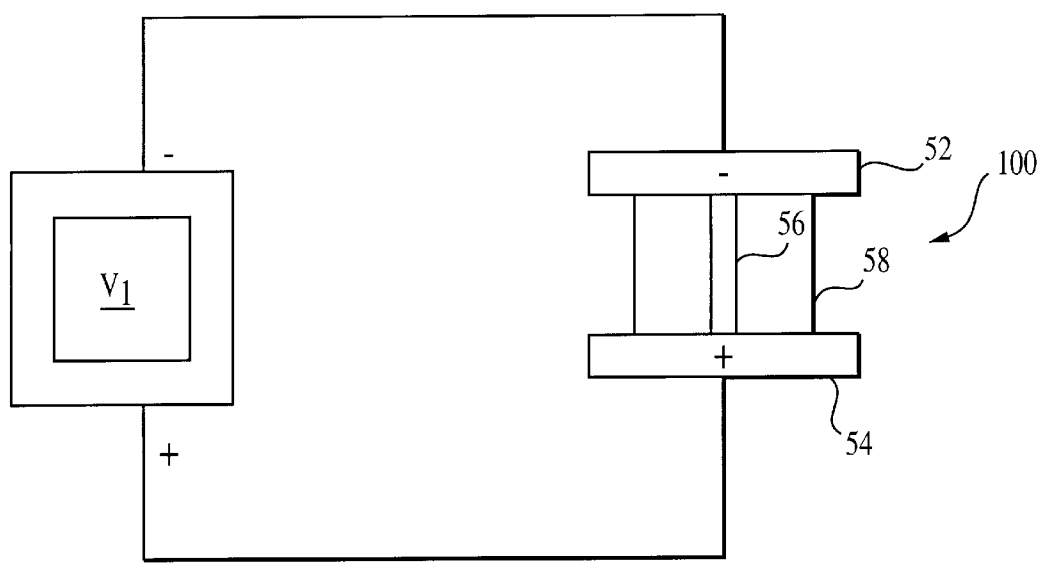
FIG. 3 is a diagram of a program circuit according to the present invention.

Referring now to FIG. 3, a PCRAM program or "write" circuit is illustrated. A first voltage $V_1$ is applied to the circuit to write information into the non-volatile memory cell 100. Application of the first voltage $V_1$ will cause the dendrite 56 to grow from the first electrode 52 towards the second electrode 54, as described above. In an exemplary embodiment of the present invention $V_1$ is greater than a threshold voltage required to begin dendrite growth and in an exemplary embodiment $V_1$ is about 0.25V. Generally any voltage higher than the predetermined threshold voltage required to begin dendrite growth will cause growth of the dendrite 56.

A grown dendrite 56 may remain intact for hours or even days. However over time, it has been found that the dendrite will begin to retract or dissolve and thus change the impedance characteristics of the cell 100 adversely affecting the memory storing capabilities of the cell 100. In accordance with the present invention, there is provided a method and circuitry for maintaining the stored state associated with a grown dendrite 56 in the non-volatile chalcogenide memory cell 100. The method and circuitry provides a stabilizing voltage for stabilizing selected cells in a memory array as wells as an entire array of memory cells. The term "maintaining" also relates to stabilizing and/or retaining dendrite growth.

Figure 4:
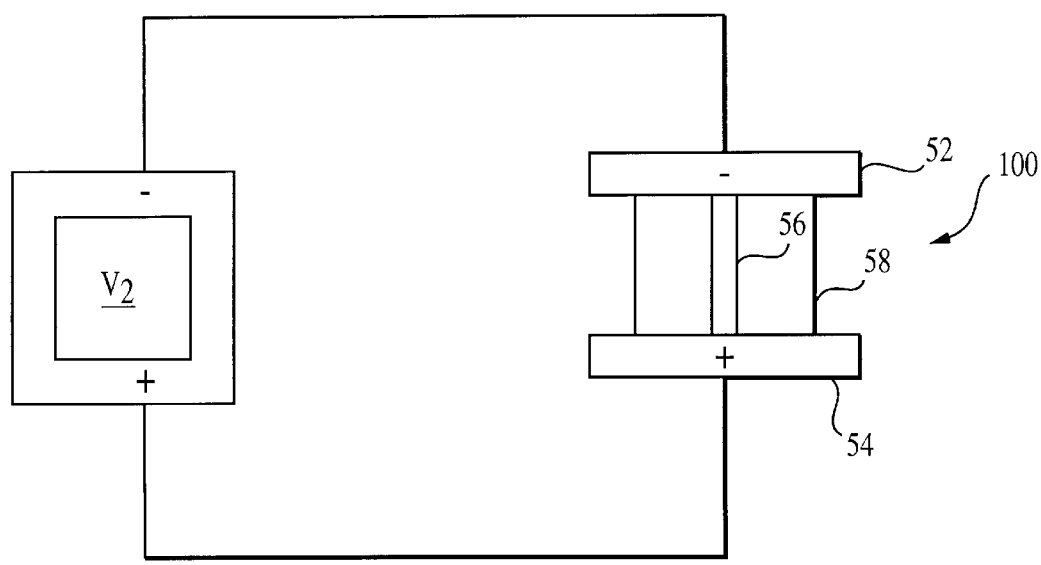
FIG. 4 is a diagram of a stabilizing circuit according to the present invention.

Referring now to FIG. 4, the stabilizing voltage is a voltage lower than the threshold voltage required to initiate dendrite growth and is termed a sub-threshold voltage. By stabilizing the cell 100 with a sub-threshold voltage $V_2$ applied across the electrodes 52, 54, which is lower than the threshold voltage required to initiate dendrite growth, and thus is also lower than the first voltage $V_1$, the stored state of the memory cell is maintained. When the second or sub-threshold voltage $V_2$ is applied via electrodes 52, 54 to the cell having a grown dendrite, it will maintain the dendrite growth and effectively act as the cell 100 stabilizing signal. The sub-threshold voltage $V_2$ does not disturb the cell 100, which has no grown dendrite that is in the "OFF" (high R) state, since the voltage $V_2$ is lower than the threshold voltage needed to initiate dendrite growth. An exemplary stabilizing sub-threshold voltage $V_2$ is in the range of 35% to 60% of the threshold voltage. For a cell, which uses $V_1$ of 0.25V for dendrite growth, an exemplary sub-threshold voltage $V_2$ is between about 0.09V to about 0.13V. The voltage sub-threshold $V_2$ may be provided as a sweep voltage, a pulse voltage, or a step voltage.

In accordance with an exemplary embodiment of the present invention, a memory cell 100 is provided as a non-volatile PCRAM memory cell having a chalcogenide glass element. The memory cell 100 is programmed with a first voltage $V_1$ of about 0.25V and the second stabilizing voltage $V_2$ is, as noted, between about 0.09V and about 0.13V. If the voltage $V_2$ is applied as a sweep voltage, a linear sweep voltage signal is provided from a first magnitude $V_1$ of about 0.09V to a second magnitude $V_h$ of about 0.13V, and preferably is provided as a triangular wave sweep voltage signal. The voltage sweep is applied across electrodes 52, 54 and involves increasing the applied voltage across the entire cell array at once to generate current-voltage over the period of time involved in carrying out the sweep. Such voltage sweeps may then be periodically repeated.

By applying a stabilizing cycle according to the invention, the stored state of the memory cell 100 is retained for extended periods of time between stabilizing sub-threshold voltage $V_2$ applications. The stored state of the cell 100 may remain in tact for minutes, hours or days. For instance, the voltage application may provide for stored states in a PCRAM device that are retained for over 40 or even 65 hours.

In another embodiment, the stabilizing sub-threshold voltage $V_2$ may be applied continuously to the cell 100, selected cells in an array of memory cells, or to an entire array of cells. For instance, the voltage $V_2$ may be a continuously applied sweep voltage, pulse voltage, or step voltage.

Figure 5:
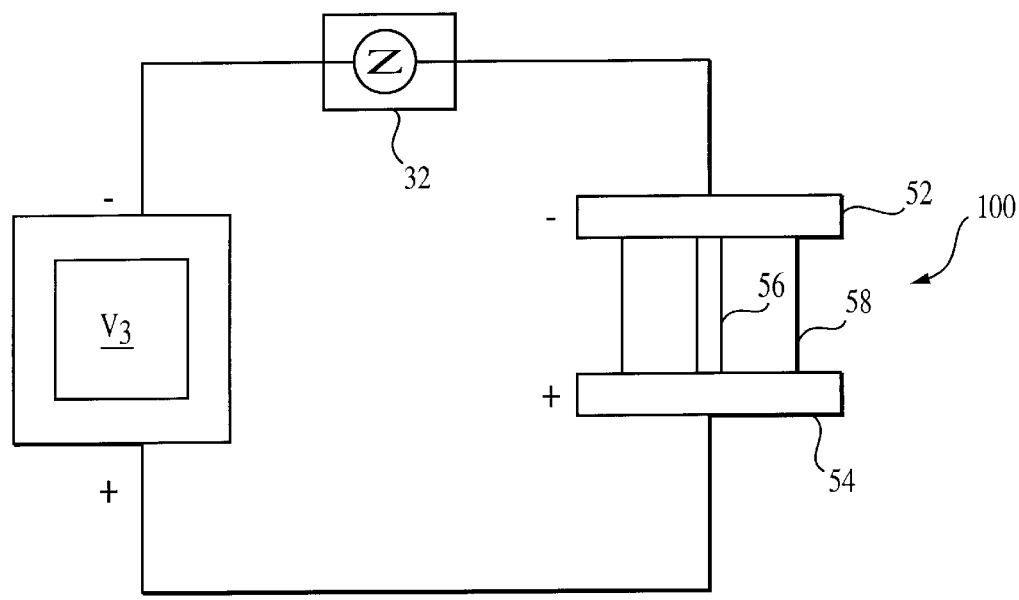
FIG. 5 is a diagram of a read-out circuit according to the present invention.

Referring now to FIG. 5, a read operation may be performed by read-selecting a cell, providing a read-out voltage $V_3$ and reading data out at the output of the current sensing amplifier 32. A third voltage source is provided for applying a read-out voltage across the electrodes 52, 54. The read out voltage $V_3$, permits the resistance of the cell 100 to be sensed. The resistance will determine the current sensed by the sense amplifier 32, which is operated to output a "0" or "1" logic level depending on the sensed current during a read operation. The read-out voltage $V_3$ may be the same as or lower than the sub-threshold voltage $V_2$. A voltage from greater than 0 to about 0.13V may be used for the read-out operation.

It has been discovered that a read-out voltage of between about 0.09V to about 0.13V applied to a memory cell or cell array will essentially act as a stabilizer and allow a memory device to retain its stored state for extended periods of time. Thus, in accordance with another exemplary embodiment of the present invention, a read-out voltage of between about 0.09V to about 0.13V is used for read out and to retain the stored memory state of the memory cell and thus alleviates the need for a stabilizing cycle. Accordingly, the read-out voltage $V_3$ does not disturb cells 100, which have no grown dendrite that are in the "OFF" (high R) state, since the voltage $V_3$ is lower than the threshold voltage needed to initiate dendrite growth. The read-out voltage may be applied to the cell, selected cells in an array of memory cells, or to an entire array. The read-out voltage may also be applied as a sweep voltage, pulse voltage, or step voltage.

Figure 6:
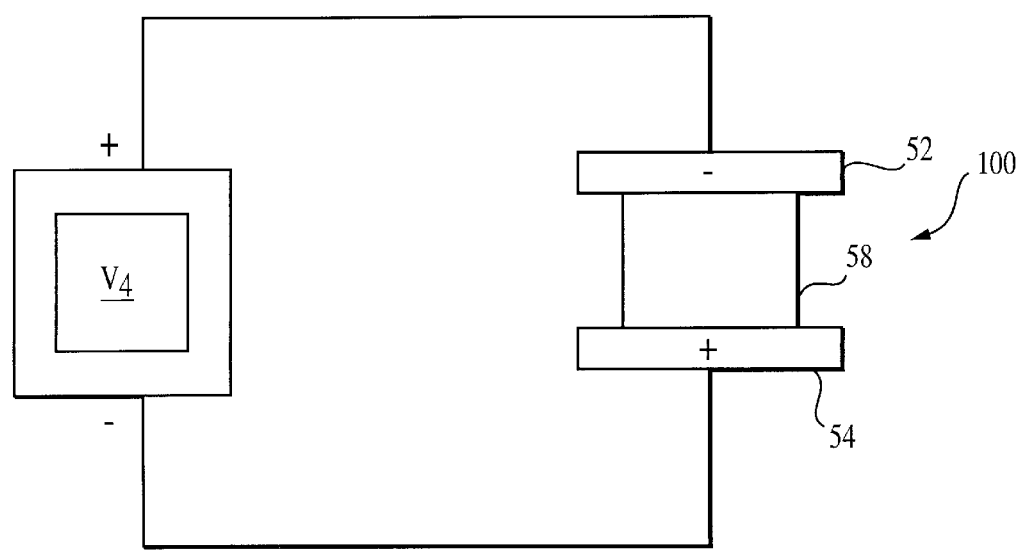
FIG. 6 is a diagram of an erase circuit according to the present invention.

Referring now to FIG. 6, applying the appropriate voltages across the electrodes for an appropriate time period generally carries out erasing memory cells in array 12. In accordance with the present invention a voltage having an opposite polarity from the write or programming voltage is applied from the first electrode 52 to the second electrode 54 to erase the memory cell. Thus, a negative voltage is applied across the second electrode 54, which causes the dendrite 56 to retract towards the first electrode 52. The amount of charge residing on the cell determines the voltage requirement. Conduction between the electrodes 52, 54 represents an "on" or erased state of the device and corresponds to a logic value of one. An exemplary erase operation may be performed by providing a negative erase voltage $V_{pp}$ from about 0 to −1V with a 20 μA compliance current. Alternatively, a high current erase, having a 1 mA compliance current, may be used.

The above description and drawings are only to be considered illustrative of exemplary embodiments, which achieve the features and advantages of the present invention. Modification and substitutions to specific process conditions and structures can be made without departing from the spirit and scope of the present invention. For instance, the applied voltages may be applied as absolute voltages or differential voltages, so long as the preferred voltage magnitudes are provided across the cell. Accordingly, the invention is not to be considered as being limited by the foregoing description and drawings, but is only limited by the scope of the appended claims.

What is claimed as new and desired to be protected by Letters Patent of the United States is:

1. A method for stabilizing a non-volatile chalcogenide memory cell having first and second electrodes, said method comprising the step of:

continuously applying a voltage across said electrodes, which has a value less than a voltage value that is required to program said cell.

2. The method of claim 1, wherein said voltage is a sweep voltage.

3. The method of claim 1, wherein said voltage is a pulse voltage.

4. The method of claim 1, wherein said voltage is a step voltage.

5. A method for stabilizing an array of non-volatile chalcogenide memory cells, comprising the step of:
applying a voltage to a plurality of said cells of said array wherein said voltage is less than a threshold voltage required for programming said cells.

6. The method of claim 5, wherein said voltage is a sweep voltage.

7. The method of claim 5, wherein said voltage is a pulse voltage.

8. The method of claim 5, wherein said voltage is a step voltage.

9. A method for operating a non-volatile chalcogenide memory cell, comprising the steps of:
programming said cell by applying a first voltage to said cell; and
stabilizing said cell by continuously applying a second voltage to said cell, wherein said second voltage is less than said first voltage.

10. The method of claim 9, wherein said second voltage is a sweep voltage.

11. The method of claim 9, wherein said second voltage is a pulse voltage.

12. The method of claim 9, wherein said second voltage is a step voltage.

13. The method of claim 9, wherein said second voltage is a read-out voltage.

14. A method for stabilizing a non-volatile chalcogenide memory cell, comprising the step of:
applying a continuous voltage between about 0.09 and about 0.13 volts to said memory cell.

15. A method for operating a non-volatile chalcogenide memory cell, comprising the steps of:
programming said cell to a predetermined state with a voltage of at least 0.25 volts; and
applying a stabilizing voltage to said cell, which is between about 0.09, and about 0.13 volts.

16. The method of claim 15, wherein said stabilizing voltage is a sweep voltage.

17. The method of claim 15, wherein said stabilizing voltage is a pulse voltage.

18. The method of claim 15, wherein said stabilizing voltage is a step voltage.

19. The method of claim 15, wherein said stabilizing voltage is applied continuously to said cell.

20. The method of claim 15, wherein said second voltage is a read-out voltage.

21. A method for operating non-volatile chalcogenide memory cells in an array, comprising the steps of:
programming selected memory cells of said array with a voltage of at least about 0.25 volts; and
maintaining a programmed state of said selected memory cells by continuously applying a stabilizing voltage having a constant value between about 0.09 and 0.13 volts to the cells of said array.

22. The method of claim 21, wherein said stabilizing voltage is a sweep voltage.

23. The method of claim 21, wherein said stabilizing voltage is a pulse voltage.

24. The method of claim 21, wherein said stabilizing voltage is a step voltage.

25. The method of claim 21, wherein said stabilizing voltage is a read-out voltage.

26. A method for stabilizing a programmed programmable conductor random access memory cell formed of at least one material capable of holding a programmed resistance state and capable of being programmed from one resistance state to another resistance state by an applied voltage, said method comprising the step of: applying a stabilizing voltage between 0.09 and 0.13 volts to an entire array of said memory cells.

27. The method of claim 26, wherein said stabilizing voltage is a sweep voltage.

28. The method of claim 26, wherein said stabilizing voltage is a pulse voltage.

29. The method of claim 26, wherein said stabilizing voltage is a step voltage.

30. The method of claim 26, wherein said stabilizing voltage is applied continuously to said cell.

31. The method of claim 26, wherein said stabilizing voltage is a read-out voltage.

32. A method for stabilizing a programmed programmable conductor random access memory cell, comprising the step of:
applying a sweep voltage from a magnitude of about 0.09 volts to a magnitude of about 0.13 volts to said cell.

33. The method of claim 32, wherein said sweep voltage is continuously applied to said cell.

34. A method for stabilizing a programmable conductor random access memory cell formed of at least one material capable of holding a programmed resistance state and capable of being programmed from one resistance state to another resistance state by an applied voltage, said method comprising the steps of:
programming said cell with a voltage of about 0.25 volts and applying a stabilizing voltage between about 0.09 and about 0.13 volts to said cell.

35. The method of claim 34, wherein said stabilizing voltage is a sweep voltage.

36. The method of claim 34, wherein said stabilizing voltage is a pulse voltage.

37. The method of claim 34, wherein said stabilizing voltage is a step voltage.

38. The method of claim 34, wherein said stabilizing voltage is applied continuously to said cell.

39. The method of claim 34, wherein said stabilizing voltage is a read-out voltage.

40. A non-volatile chalcogenide memory cell, wherein said cell is programmed by a first voltage and stabilized by a second voltage which is less than said first voltage, wherein said second voltage is not a read-out voltage.

41. A non-volatile chalcogenide memory cell, wherein said cell is programmed by a first voltage and stabilized by a read-out voltage having a constant value in a range of about 35% to about 60% of said first voltage.

42. The memory cell of claim 41, wherein said read-out voltage is a positive voltage to positive voltage sweep.

43. A memory cell comprising:
a chalcogenide glass element;
first and second electrodes connected to said chalcogenide glass element;
a first voltage source for applying a programming voltage across said first and second electrodes to program said cell from a first stored state to a second stored state; and
a second voltage source for continuously applying a stabilizing voltage across said first and second electrodes to maintain said second stored state, wherein said stabilizing voltage is not a read-out voltage.

44. The memory cell of claim 43, wherein said stabilizing voltage is a sweep voltage.

45. The memory cell of claim 43, wherein said stabilizing voltage is a pulse voltage.

46. The memory cell of claim 43, wherein said stabilizing voltage is a step voltage.

47. The memory cell of claim 43, wherein said stabilizing voltage is continuously applied to said cell.

48. The memory cell of claim 43, wherein said memory cell is in a programmable conductor random access memory device.

49. A memory structure comprising:
a memory cell comprising at least one material capable of holding a programmed resistance state and capable of being programmed from one resistance state to another resistance state by an applied voltage;
a first voltage source for applying a programming voltage across said memory cell to place said cell in one programmed resistance state; and
a second voltage source for continuously applying a stabilizing voltage across said memory cell to maintain said cell in said one resistance state, wherein said stabilizing voltage has a value less than that of said programming voltage and said stabilizing voltage is not a read-out voltage.

50. The structure of claim 49, wherein said stabilizing voltage is a sweep voltage.

51. The structure of claim 49, wherein said stabilizing voltage is a pulse voltage.

52. The structure of claim 49, wherein said stabilizing voltage is a step voltage.

53. The structure of claim 49, wherein said stabilizing voltage is a continuously applied voltage.

54. A memory structure comprising:
a memory cell comprising at least one material capable of holding a programmed resistance state and capable of being programmed from one resistance state to another resistance state by an applied voltage;
a first voltage source for applying a programming voltage of at least about 0.25 volts across said cell to program said cell from a first resistance state to a second resistance state; and
a second voltage source for continuously applying a stabilizing voltage having a constant value between about 0.09 and 0.13 volts across said cell to maintain said second resistance state.

55. The structure of claim 54, wherein said stabilizing voltage is a sweep voltage.

56. The structure of claim 54, wherein said stabilizing voltage is a pulse voltage.

57. The structure of claim 54, wherein said stabilizing voltage is a step voltage.

58. The structure of claim 54, wherein said stabilizing voltage is a continuously applied voltage.

59. The structure of claim 54, wherein said stabilizing voltage is a read-out voltage.

60. A memory cell comprising:
a chalcogenide glass element;
first and second electrodes connected to said chalcogenide glass element;
a first voltage source for applying a programming voltage of at least about 0.25 volts across said first and second electrodes to program said cell from a first stored state to a second stored state; and
a second voltage source for continuously applying a stabilizing voltage having a constant value between about 0.09 and 0.13 volts across said first and second electrodes to maintain said second stored state.

61. The memory cell of claim 60, wherein said stabilizing voltage is a sweep voltage.

62. The memory cell of claim 60, wherein said stabilizing voltage is a pulse voltage.

63. The memory cell of claim 60, wherein said stabilizing voltage is a step voltage.

64. The memory cell of claim 60, wherein said stabilizing voltage is continuously applied to said cell.

65. The memory cell of claim 60, wherein said stabilizing voltage is a read-out voltage.

66. A method for operating a non-volatile chalcogenide memory cell, comprising the steps of:
programming said cell by applying a first voltage to said cell;
stabilizing said cell by applying a second voltage to said cell, which is less than said first voltage;
and reading said cell by applying a third voltage to said cell, wherein said third voltage is less than or equal to said second voltage.

67. A method for operating a non-volatile chalcogenide memory cell, comprising the steps of:
programming said cell to a predetermined state with a voltage of at least 0.25 volts;
applying a stabilizing voltage to said cell at between about 0.09 and about 0.13 volts; and
reading said cell by applying a voltage of from greater than about 0 volts to about 0.13 volts to said cell.

68. A method for operating non-volatile chalcogenide memory cells in an array, comprising the steps of:
programming selected memory cells of said array with a voltage of at least about 0.25 volts;
maintaining a programmed state of said selected memory cells by applying a stabilizing voltage between about 0.09 and about 0.13 volts to said array; and
reading said array by applying a voltage of from greater than about 0 volts to about 0.13 volts to said array.

69. A method of stabilizing a programmable conductor random access memory cell formed of at least one material capable of holding a programmed resistance state and capable of being programmed from one resistance state to another resistance state by an applied voltage, said method comprising the steps of:
applying a stabilizing voltage between 0.09 and 0.13 volts to selected memory cells in said array of said memory cells; and
reading a selected memory cell in said array by applying a voltage of greater than about 0 volts to about 0.13 volts to said selected memory cell.

70. A programmable conductor random access memory device comprising:
a chalcogenide glass element;
first and second electrodes connected to said chalcogenide glass element;
a first voltage source for applying a programming voltage across said first and second electrodes to program said device from a first stored state to a second stored state;
a second voltage source for applying a stabilizing voltage across said first and second electrodes to maintain said second stored state, wherein said second voltage is less than said first voltage; and
a third voltage source for applying a read-out voltage across said first and second electrodes to read data out of said device.

71. A memory structure comprising:
a memory cell comprising at least one material capable of holding a resistance state and capable of being programmed from one resistance state to another resistance state by an applied voltage;

a first voltage source for applying a programming voltage across said memory cell to program said memory cell from a first resistance state to a second resistance state;

a second voltage source for continuously applying a read-out voltage across said memory cell which maintains said second resistance state, said read-out voltage having a constant value that is about 35% to about 60% of said programming voltage value; and a third voltage source for applying an erase voltage across said memory cell to erase said memory cell to said first resistance state.

72. A memory structure comprising:

a memory cell comprising at least one material capable of holding a programmed resistance state and capable of being programmed from one resistance state to another resistance state by an applied voltage;

a first voltage source for applying a programming voltage of at least 0.25 volts across said memory cell to program said memory cell from a first resistance state to a second resistance state;

a second voltage source for applying a stabilizing voltage between about 0.09 and 0.13 volts across said memory cell to maintain said second resistance state; and a third voltage source for applying a read-out voltage from about 0 volts to about 0.13 volts across said memory cell to read-out said memory cell.

73. A programmable conductor random access memory device comprising:

a chalcogenide glass element;

first and second electrodes connected to said chalcogenide glass element;

a first voltage source for applying a programming voltage of at least 0.25 volts across said first and second electrodes to program said device from a first stored state to a second stored state;

a second voltage source for applying a stabilizing voltage between about 0.09 and 0.13 volts across said first and second electrodes to maintain said second stored state; and a third voltage source for applying a read-out voltage from about 0 volts to about 0.13 volts across said first and second electrodes to read-out said device.

74. A method of stabilizing a non-volatile programmable conductor random access memory cell formed of at least one material capable of holding a programmed resistance state, said method comprising the steps of:

programming selected memory cells in an array of said memory cells with a voltage of at least 0.25 volts; and applying a read-out voltage between 0.09 and 0.13 volts to selected cells of said array.

75. The method of claim 74, wherein said read-out voltage is a sweep voltage.

76. The method of claim 74, wherein said read-out voltage is a pulse voltage.

77. The method of claim 74, wherein said read-out voltage is a step voltage.

78. The method of claim 74, further wherein said read-out voltage is applied continuously to said array.

79. A memory cell comprising:

a chalcogenide glass element;

first and second electrodes connected to said chalcogenide glass element;

a first voltage source for applying a programming voltage across said first and second electrodes to program said cell from a first stored state to a second stored state; and a second voltage source for continuously applying a read-out voltage across said first and second electrodes to maintain said second stored state, said readout voltage having a constant value that is about 35% to about 60% of said programming voltage.

80. The memory cell of claim 79, wherein said read-out voltage is a sweep voltage.

81. The memory cell of claim 79, wherein said read-out voltage is a pulse voltage.

82. The memory cell of claim 79, wherein said read-out voltage is a step voltage.

83. The memory cell of claim 79, wherein said read-out voltage is continuously applied to said cell.

84. A method for operating a non-volatile chalcogenide memory cell, comprising the steps of:

programming said cell to a predetermined state with a voltage of at least about 0.25 volts;

reading said cell by continuously applying a read-out voltage to said cell having a constant value of between about 0.09 and about 0.13 volts, wherein said read-out voltage stabilizes said cell; and erasing said cell by applying a voltage having a constant value from about less than 0 to about −1 volts.

85. A method for operating a non-volatile chalcogenide memory cell, comprising the steps of:

programming said cell to a predetermined state with a voltage of at least 0.25 volts;

applying a stabilizing voltage to said cell at between about 0.09 and about 0.13 volts; and erasing said cell by applying a voltage between about 0 and about −1 volts.

86. A method for operating a non-volatile chalcogenide memory cell, comprising the steps of:

programming said cell by applying a first voltage to said cell;

stabilizing said cell by continuously applying a read-out voltage to said cell, which has a constant value in a range of about 35% to about 60% of said first voltage;

and erasing said cell by applying a third voltage to said cell, wherein said third voltage is less than said read-out voltage.

87. A method for operating a non-volatile chalcogenide memory cell, comprising the steps of:

programming said cell by applying a first voltage to said cell;

stabilizing said cell by applying a second voltage to said cell, which is less than said first voltage;

reading said cell by applying a third voltage to said cell, wherein said third voltage is less than said second voltage; and erasing said cell by applying a fourth voltage to said cell, which is less than said third voltage.

88. A method for operating non-volatile chalcogenide memory cells in an array, comprising the steps of:

programming selected memory cells of said array with a voltage of at least 0.25 volts;

maintaining a programmed state of said selected memory cells by continuously applying a stabilizing voltage between 0.09 and 0.13 volts to said array;

reading said selected memory cells by continuously applying a constant voltage value of from about greater than 0 volts to about 0.13 volts to said array and erasing said selected memory cells by applying a voltage of from about less than 0 volts to about −1 volts to said array.

89. A memory cell comprising:

a chalcogenide glass element;

first and second electrodes connected to said chalcogenide glass element;

a first voltage source for applying a programming voltage across said first and second electrodes to program said cell from a first stored state to a second stored state;

a second voltage source for continuously applying a read-out voltage having a constant value in a range of about 35% to about 60% of said programming voltage across said first and second electrodes to maintain said second stored state; and a third voltage source for applying an erase voltage across said first and second electrodes to erase said memory cell.

90. The memory cell of claim 89, wherein said read-out voltage begins at a positive non-zero voltage value.

91. A memory structure comprising:

a memory cell comprising a first electrode and a second electrode in electrical communication with at least one material capable of holding a programmed resistance state and capable of being programmed from one resistance state to another resistance state by an applied voltage;

a first voltage source for applying a programming voltage of at least 0.25 volts across said memory cell to program said memory cell from a first stored state to a second stored state;

a second voltage source for applying a stabilizing voltage between about 0.09 and 0.13 volts across said memory cell to maintain said second stored state;

a third voltage source for applying a read-out voltage from about greater than 0 volts to about 13 volts across said memory cell to read-out said cell; and a fourth voltage source for applying an erase voltage from about 0 volts to about −1 volts.

92. A memory structure comprising:

a chalcogenide glass element;

first and second electrodes connected to said chalcogenide glass element;

a first voltage source for applying a programming voltage of at least 0.25 volts across said first and second electrodes to program said cell from a first stored state to a second stored state;

a second voltage source for applying a stabilizing voltage between about 0.09 and 0.13 volts across said first and second electrodes to maintain said second stored state;

a third voltage source for applying a read-out voltage from about 0 volts to about 0.13 volts across said first and second electrodes to read-out said cell; and a fourth voltage source for applying an erase voltage from about 0 volts to about −1 volts across said first and second electrodes to erase said cell.

93. A method for operating a non-volatile chalcogenide memory cell having at least one layer of chalcogenide material, said method comprising the steps of:

programming said cell by applying a first voltage to said cell; and stabilizing said cell by applying a second voltage to said cell, wherein said second voltage is from about 35% to about 60% of said first voltage.

94. A memory structure comprising:

a memory cell comprising a first electrode and a second electrode in electrical communication with at least one material capable of holding a programmed resistance state and capable of being programmed from one resistance state to another resistance state by an applied voltage;

a first voltage source for applying a programming voltage across memory cell to program said memory cell from a first stored state to a second stored state; and a second voltage source for applying a stabilizing voltage across said memory cell to maintain said second stored state wherein said stabilizing voltage has a value from about 35% to about 60% of the programming voltage value.

95. A method for stabilizing a programmed programmable conductor random access memory cell formed of at least one material capable of holding a programmed resistance state and capable of being programmed from one resistance state to another resistance state by an applied voltage, said method comprising the step of:

applying a first programming voltage to said memory cell to program said cell to a first memory state; and applying a second stabilizing voltage to said memory cell to maintain said cell in said first memory state, wherein said second stabilizing voltage is less than said first programming voltage and said second stabilizing voltage is not a read-out voltage.

96. The method of claim 95, further comprising applying said first programming voltage to an entire array of said memory cells.

97. The method of claim 95, further comprising applying said second stabilizing voltage to an entire array of said memory cells.

98. A method for operating a non-volatile chalcogenide memory cell having at least one layer of chalcogenide material, said method comprising the steps of:

programming said cell by applying a first voltage to said cell; and stabilizing said cell by applying a second voltage to said cell, wherein said second voltage is less than said first voltage and said second voltage is not a read-out voltage.

99. The method of claim 98, further comprising applying said first voltage to an entire array of said memory cells.

100. The method of claim 98, further comprising applying said second voltage to an entire array of said memory cells.

101. The method of claim 1, wherein said voltage is not a read-out voltage.

102. The method of claim 5, wherein said voltage is not a read-out voltage.

103. The method of claim 9, wherein said second voltage is not a read-out voltage.

104. The method of claim 14, wherein said continuous voltage is not a read-out voltage.

105. The method of claim 15, wherein said stabilizing voltage is not a read-out voltage.

106. The memory cell of claim 41, wherein said read-out voltage begins at a positive non-zero voltage value.

107. The memory cell of claim 60, wherein said stabilizing voltage is not a read-out voltage.

108. The method of claim 85, wherein said stabilizing voltage is not a read-out voltage.

109. The structure of claim 54, wherein said stabilizing voltage is not a read-out voltage.

110. The method of claim 91, wherein said second voltage is not a read-out voltage.

111. A non-volatile chalcogenide memory cell, wherein said cell is programmed by a first voltage and stabilized by a read-out voltage having a positive voltage to positive voltage sweep.

* * * * *

UNITED STATES PATENT AND TRADEMARK OFFICE
CERTIFICATE OF CORRECTION

PATENT NO.      : 6,646,902 B2
DATED           : November 11, 2003
INVENTOR(S)     : Terry L. Gilton et al.

It is certified that error appears in the above-identified patent and that said Letters Patent is hereby corrected as shown below:

Title page,
Item [56], References Cited, OTHER PUBLICATIONS, add:
-- Boolchand, P.; Georgiev, D.G.; Goodman, B., Discovery of the Intermediate Phase in Chalcogenide Glasses, J. Optoelectronics and Advanced Materials, 3 (2001), 703.
Fadel, M., Switching phenomenon in evaporated Se-Ge-As thin films of amorphous chalcogenide glass, Vacuum 44 (1993) 851-855.
Mitkova, M.; Kozicki, M.N., Silver incorporation in Ge-Se glasses used in programmable metallization cell devices, J. Non-Cryst. Solids 299-302 (2002) 1023-1027.
Miyatani, S.-y., Electrical properties of Ag2Se, J. Phys. Soc. Japan 13 (1958) 317.
Neale, R.G.; Aseltine, J.A., The application of amorphous materials to computer memories, IEEE transactions on electron dev. Ed-20 (1973) 195-209.
Ovshinsky S.R.; Fritzsche, H., Reversible structural transformations in amorphous semiconductors for memory and logic, Mettalurgical transactions 2 (1971) 641-645.
Ovshinsky S.R., Reversible electrical switching phenomena in disordered structures, Phys. Rev. Lett. 21 (1968) 1450-1453.
Owen, A.E.; LeComber, P.G.; Sarrabayrouse, G.; Spear, W.E., New amorphous-silicon electrically programmable nonvolatile switching device, IEE Proc. 129 (1982) 51-54.
Owen, A.E.; Firth, A.P.; Ewen, P.J.S., Photo-induced structural and physico-chemical changes in amorphous chalcogenide semiconductors, Phil. Mag. B 52 (1985) 247-362.
Owen, A.E.; Le Comber, P.G.; Hajto, J.; Rose, M.J.; Snell, A.J., Switching in amorphous devices, Int. J. Electronics 73 (1992) 897-906.
Pearson, A.D.; Miller, C.E., Filamentary conduction in semiconducting glass diodes, App. Phys. Lett. 14 (1969) 280-282.
Pinto, R.; Ramanathan, K.V., Electric field induced memory switching in thin films of the chalcogenide system Ge-As-Se, Appl. Phys. Lett. 19 (1971) 221-223.
Popescu, C., The effect of local non-uniformities on thermal switching and high field behavior of structures with chalcogenide glasses, Solid-state electronics 18 (1975) 671-681.
Popescu, C.; Croitoru, N., The contribution of the lateral thermal instability to the switching phenomenon, J. Non-Cryst. Solids 8-10 (1972) 531-537.
Popov, A.I.; Geller, I.KH.; Shemetova, V.K., Memory and threshold switching effects in amorphous Selenium, Phys. Stat. Sol. (a) 44 (1977) K71-K73.
Prakash, S.; Asokan, S.; Ghare, D.B., Easily reversible memory switching in Ge-As-Te glasses, J. Phys. D: Appl. Phys. 29 (1996) 2004-2008.
Rahman, S.; Sivarama Sastry, G., Electronic switching in Ge-Bi-Se-Te glasses, Mat. Sci. and Eng. B12 (1992) 219-222.
Ramesh, K.; Asokan, S.; Sangunni, K.S.; Gopal, E.S.R., Electrical Switching in germanium telluride glasses doped with Cu and Ag, Appl. Phys. A 69 (1999) 421-425.

UNITED STATES PATENT AND TRADEMARK OFFICE
CERTIFICATE OF CORRECTION

PATENT NO. : 6,646,902 B2
DATED : November 11, 2003
INVENTOR(S) : Terry L. Gilton et al.

It is certified that error appears in the above-identified patent and that said Letters Patent is hereby corrected as shown below:

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.
Rose,M.J.;Snell,A.J.;Lecomber,P.G.;Hajto,J.;Fitzgerald,A.G.;Owen,A.E., Aspects of non-volatility in a-Si:H memory devices, Mat. Res. Soc. Symp. Proc. V 258, 1992, 1075-1080.
Schuocker, D.; Rieder, G., On the reliability of amorphous chalcogenide switching devices, J. Non-Cryst. Solids 29 (1978) 397-407.
Sharma, A.K.; Singh, B., Electrical conductivity measurements of evaporated selenium films in vacuum, Proc. Indian Natn. Sci. Acad. 46, A, (1980) 362-368.
Sharma, P., Structural, electrical and optical properties of silver selenide films, Ind. J. Of pure and applied Phys. 35 (1997) 424-427.
Snell, A.J.; Lecomber, P.G.; Hajto, J.; Rose, M.J.; Owen, A.E.; Osborne, I.L., Analogue memory effects in metal/a-Si:H/metal memory devices. J. Non-Cryst. Solids 137-138 (1991) 1257-1262.
Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.
Steventon, A.G., Microfilaments in amorphous chalcogenide memory devices, J. Phys. D: Appl. Phys. 8 (1975) L120-L122.
Steventon, A.G., The switching mechanisms in amorphous chalogenide memory devices, J. Non-Cryst. Solids 21 (1976) 319-329.
Stocker, H.J., Bulk and thin film switching and memory effects in semiconducting chalcogenide glasses, App. Phys. Lett. (1969) 55-57. --.
The following errors should be corrected:
"Aleksiejunas, A.; Gesnys, A., Switching phenomenon and memory effect in thin-film heterojunction of polycrystalline selenium-silver selenide, Phys. Stat. Sol. (a) 19 (1973) K169-K171." should read,
-- Aleksiejunas, A.; Cesnys, A., Switching phenomenon and memory effect in thin-film heterojunction of polycrystalline selenium-silver selenide, Phys. Stat. Sol. (a) 19 (1973) K169-K171. --;
"de Boer, W., Threshold switching in hydrogenated amorphous silicon, Appl. Phys. Lett. 40 (1982) 812-813." should read,
-- den Boer, W., Threshold switching in hydrogenated amorphous silicon, Appl. Phys. Lett. 40 (1982) 812-813. --;
"Hegab, N.A.; Fadel, M.; Sedeek, K., Memory switching phenomena in this films of chalcogenide semiconductors, Vacuum 45 (1994) 459-462." should read,
-- Hegab, N.A.; Fadel, M.; Sedeek, K., Memory switching phenonmena in thin films of chalcogenide semiconductors, Vacuum 45 (1994) 459-462. --; and

UNITED STATES PATENT AND TRADEMARK OFFICE
CERTIFICATE OF CORRECTION

PATENT NO.    : 6,646,902 B2
DATED         : November 11, 2003
INVENTOR(S)   : Terry L. Gilton et al.

It is certified that error appears in the above-identified patent and that said Letters Patent is hereby corrected as shown below:

OTHER PUBLICATIONS (cont'd),
  "Narayanan, R.A.; Asokan, S.; Kumar, A., Evidence concerning the effect of topology on ..." should read,
  -- Narayanan, R.A.; Asokan, S.; Kumar, A., Evidence concerning the effect of topology on electrical switching in chalcogenide network glasses, Phys. Rev. B 54 (1996) 4413-4415. --.

<u>Column 14,</u>
Line 60, "91," should read -- 93, --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,646,902 B2
APPLICATION NO. : 09/941648
DATED : November 11, 2003
INVENTOR(S) : Terry L. Gilton et al.

It is certified that error appears in the above-identified patent and that said Letters Patent is hereby corrected as shown below:

Title page,
Item [56], References Cited, OTHER PUBLICATIONS, add:
-- Boolchand, P.; Georgiev, D.G.; Goodman, B., Discovery of the Intermediate Phase in Chalcogenide Glasses, J. Optoelectronics and Advanced Materials, 3 (2001), 703.
Fadel, M., Switching phenomenon in evaporated Se-Ge-As thin films of amorphous chalcogenide glass, Vacuum 44 (1993) 851-855.
Mitkova, M.; Kozicki, M.N., Silver incorporation in Ge-Se glasses used in programmable metallization cell devices, J. Non-Cryst. Solids 299-302 (2002) 1023-1027.
Miyatani, S.-y., Electrical properties of $Ag_2Se$, J. Phys. Soc. Japan 13 (1958) 317.
Neale, R.G.; Aseltine, J.A., The application of amorphous materials to computer memories, IEEE transactions on electron dev. Ed-20 (1973) 195-209.
Ovshinsky S.R.; Fritzsche, H., Reversible structural transformations in amorphous semiconductors for memory and logic, Mettalurgical transactions 2 (1971) 641-645.
Ovshinsky S.R., Reversible electrical switching phenomena in disordered structures, Phys. Rev. Lett. 21 (1968) 1450-1453.
Owen, A.E.; LeComber, P.G.; Sarrabayrouse, G.; Spear, W.E., New amorphous-silicon electrically programmable nonvolatile switching device, IEE Proc. 129 (1982) 51-54.
Owen, A.E.; Firth, A.P.; Ewen, P.J.S., Photo-induced structural and physico-chemical changes in amorphous chalcogenide semiconductors, Phil. Mag. B 52 (1985) 347-362.
Owen, A.E.; Le Comber, P.G.; Hajto, J.; Rose, M.J.; Snell, A.J., Switching in amorphous devices, Int. J. Electronics 73 (1992) 897-906.
Pearson, A.D.; Miller, C.E., Filamentary conduction in semiconducting glass diodes, App. Phys. Lett. 14 (1969) 280-282.
Pinto, R.; Ramanathan, K.V., Electric field induced memory switching in thin films of the chalcogenide system Ge-As-Se, Appl. Phys. Lett. 19 (1971) 221-223.
Popescu, C., The effect of local non-uniformities on thermal switching and high field behavior of structures with chalcogenide glasses, Solid-state electronics 18 (1975) 671-681.
Popescu, C.; Croitoru, N., The contribution of the lateral thermal instability to the switching phenomenon, J. Non-Cryst. Solids 8-10 (1972) 531-537.
Popov, A.I.; Geller, I.KH.; Shemetova, V.K., Memory and threshold switching effects in amorphous Selenium, Phys. Stat. Sol. (a) 44 (1977) K71-K73.
Prakash, S.; Asokan, S.; Ghare, D.B., Easily reversible memory switching in Ge-As-Te glasses, J. Phys. D: Appl. Phys. 29 (1996) 2004-2008.
Rahman, S.; Sivarama Sastry, G., Electronic switching in Ge-Bi-Se-Te glasses, Mat. Sci. and Eng. B12 (1992) 219-222.
Ramesh, K.; Asokan, S.; Sangunni, K.S.; Gopal, E.S.R., Electrical Switching in germanium telluride glasses doped with Cu and Ag, Appl. Phys. A 69 (1999) 421-425.

UNITED STATES PATENT AND TRADEMARK OFFICE
CERTIFICATE OF CORRECTION

PATENT NO.       : 6,646,902 B2
APPLICATION NO. : 09/941648
DATED            : November 11, 2003
INVENTOR(S)      : Terry L. Gilton et al.

It is certified that error appears in the above-identified patent and that said Letters Patent is hereby corrected as shown below:

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.
Rose,M.J.;Snell,A.J.;Lecomber,P.G.;Hajto,J.;Fitzgerald,A.G.;Owen,A.E., Aspects of non-volatility in a-Si:H memory devices, Mat. Res. Soc. Symp. Proc. V 258, 1992, 1075-1080.
Schuocker, D.; Rieder, G., On the reliability of amorphous chalcogenide switching devices, J. Non-Cryst. Solids 29 (1978) 397-407.
Sharma, A.K.; Singh, B., Electrical conductivity measurements of evaporated selenium films in vacuum, Proc. Indian Natn. Sci. Acad. 46, A, (1980) 362-368.
Sharma, P., Structural, electrical and optical properties of silver selenide films, Ind. J. Of pure and applied Phys. 35 (1997) 424-427.
Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.
Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.
Steventon, A.G., Microfilaments in amorphous chalcogenide memory devices, J. Phys. D: Appl. Phys. 8 (1975) L120-L122.
Steventon, A.G., The switching mechanisms in amorphous chalogenide memory devices, J. Non-Cryst. Solids 21 (1976) 319-329.
Stocker, H.J., Bulk and thin film switching and memory effects in semiconducting chalcogenide glasses, App. Phys. Lett. 15 (1969) 55-57. --.
The following errors should be corrected:
  "Aleksiejunas, A.; Gesnys, A., Switching phenomenon and memory effect in thin-film heterojunction of polycrystalline selenium-silver selenide, Phys. Stat. Sol. (a) 19 (1973) K169-K171." should read,
  -- Aleksiejunas, A.; Cesnys, A., Switching phenomenon and memory effect in thin-film heterojunction of polycrystalline selenium-silver selenide, Phys. Stat. Sol. (a) 19 (1973) K169-K171. --;
  "de Boer, W., Threshold switching in hydrogenated amorphous silicon, Appl. Phys. Lett. 40 (1982) 812-813." should read,
  -- den Boer, W., Threshold switching in hydrogenated amorphous silicon, Appl. Phys. Lett. 40 (1982) 812-813. --;
  "Hegab, N.A.; Fadel, M.; Sedeek, K., Memory switching phenomena in this films of chalcogenide semiconductors, Vacuum 45 (1994) 459-462." should read,
  -- Hegab, N.A.; Fadel, M.; Sedeek, K., Memory switching phenomena in thin films of chalcogenide semiconductors, Vacuum 45 (1994) 459-462. --; and

UNITED STATES PATENT AND TRADEMARK OFFICE
CERTIFICATE OF CORRECTION

PATENT NO. : 6,646,902 B2
APPLICATION NO. : 09/941648
DATED : November 11, 2003
INVENTOR(S) : Terry L. Gilton et al.

It is certified that error appears in the above-identified patent and that said Letters Patent is hereby corrected as shown below:

OTHER PUBLICATIONS (cont'd),
    "Narayanan, R.A.; Asokan, S.; Kumar, A., Evidence concerning the effect of topology on ..." should read,
    -- Narayanan, R.A.; Asokan, S.; Kumar, A., Evidence concerning the effect of topology on electrical switching in chalcogenide network glasses, Phys. Rev. B 54 (1996) 4413-4415. --.

Column 14,
Line 60, "91," should read -- 93, --.

This certificate supersedes Certificate of Correction issued February 21, 2006.

Signed and Sealed this

Eighth Day of August, 2006

JON W. DUDAS
*Director of the United States Patent and Trademark Office*